United States Patent
Bruel (10) Patent No.: US 7,846,816 B2
(45) Date of Patent: Dec. 7, 2010

(54) METHOD FOR PRODUCING A MULTILAYER STRUCTURE COMPRISING A SEPARATING LAYER

(75) Inventor: Michel Bruel, Voroize (FR)

(73) Assignee: S.O.I. Tec Silicon on Insulator Technologies, Bernin (FR)

( * ) Notice: Subject to any disclaimer, the term of this patent is extended or adjusted under 35 U.S.C. 154(b) by 371 days.

(21) Appl. No.: 11/628,185

(22) PCT Filed: May 20, 2005

(86) PCT No.: PCT/FR2005/001262

§ 371 (c)(1),
(2), (4) Date: Nov. 4, 2008

(87) PCT Pub. No.: WO2006/000669

PCT Pub. Date: Jan. 5, 2006

(65) Prior Publication Data

US 2009/0053877 A1    Feb. 26, 2009

(30) Foreign Application Priority Data

Jun. 1, 2004  (FR)  .................... 04 05883

(51) Int. Cl.
*H01L 21/46* (2006.01)
(52) U.S. Cl. ............ 438/458; 438/455; 438/468; 438/E21.437
(58) Field of Classification Search ........... 438/308, 438/378, 455–458, 464, 483
See application file for complete search history.

(56) References Cited

U.S. PATENT DOCUMENTS

| | | | |
|---|---|---|---|
| 4,415,373 A | 11/1983 | Pressley | |
| 4,452,644 A | 6/1984 | Bruel et al. | |
| 6,300,208 B1 | 10/2001 | Talwar et al. | |
| 6,429,095 B1 | 8/2002 | Sakaguchi | |
| 6,521,511 B1 | 2/2003 | Inoue et al. | |
| 6,555,439 B1 | 4/2003 | Xiang et al. | |
| 6,613,678 B1 | 9/2003 | Sakaguchi | |

(Continued)

OTHER PUBLICATIONS

Search Report for French Application No. 0405883, 1 page.

*Primary Examiner*—Dung Anh Le
(74) *Attorney, Agent, or Firm*—Meyertons, Hood, Kivlin, Kowert & Goetzel, P.C.; Eric B. Meyertons (57) ABSTRACT

Process for producing a multilayer structure that includes, within the depth thereof, a separating layer, including: producing an initial multilayer structure comprising a base substrate, a surface substrate and, between the base substrate and the surface substrate, an absorbent layer that can absorb a light power flux in at least one zone and a liquefiable intermediate layer that includes, in at least one zone, impurities having a coefficient of segregation relative to the material constituting this intermediate layer of less than unity; and in subjecting, for a defined time and in the form of at least one pulse, said initial structure to said light power flux, this flux being regulated so as to liquefy at least one portion of said intermediate layer under the effect of the propagation of the thermal energy, in such a way that it results, thanks to the initial presence of said impurities, in a modification of at least one characteristic and/or of at least one property of said intermediate layer arising from the at least partial solidification of said intermediate layer, such that this intermediate layer at least partially constitutes a separating layer.

29 Claims, 3 Drawing Sheets

U.S. PATENT DOCUMENTS

6,818,530 B2  11/2004  Shimoda et al.
6,982,212 B2  1/2006   Stolk
7,402,505 B1* 7/2008   Krivokapic .................. 438/486
2004/0046288 A1* 3/2004 Chou ......................... 264/479

* cited by examiner

FIG_3

FIG_4

METHOD FOR PRODUCING A MULTILAYER STRUCTURE COMPRISING A SEPARATING LAYER

BACKGROUND OF THE INVENTION

1. Field of the Invention

The present invention relates to the general technical field of material treatment, in particular the field of thin films, especially semiconductor thin films, the field of wafers of material, the field of semiconductor wafers, especially silicon wafers, and wafers of type IV and type IV-IV semiconductors, in order to obtain electronic or optoelectronic components such as integrated circuits, photovoltaic elements or cells, or microelectromechanical systems (MEMS) or microoptoelectromechanical systems (MOEMS) or display devices, such as flat screens or camera devices.

2. Prior Art

European patent EP-A-0 924 769 discloses a process in which a structure is fabricated by successively stacking several layers. During its production, one particular layer is located within the depth of the final structure, which layer has the intrinsic property, when it is subsequently subjected to a light flux, of selectively absorbing this flux and of causing an exfoliation effect that allows the structure to be divided into two wafers.

According to one example described, the fabricated structure, formed by a multilayer stack includes, within its depth, a hydrogen-rich amorphous silicon layer. Applying a light flux to this structure results in rapid evolution of hydrogen in this layer, such that the structure divides.

SUMMARY OF THE INVENTION

One embodiment is directed to a method to produce a multilayer structure having, within the depth thereof, a separating layer.

The method further includes producing said separating layer after the fabrication of the multilayer structure.

One embodiment is directed to a multilayer structure having, within its depth, a separating layer between a surface layer, intended to be separated from the structure, and the rest of the structure.

One embodiment is directed to an easier and more varied choice of the base structure on which the surface intended to be separated is produced.

As an example, one embodiment is directed to a method to produce a separating layer in a multilayer structure in which a surface layer intended to be separated is a single-crystal layer and is obtained by growth on a single-crystal substrate of the same lattice parameter, without the quality of the single-crystal surface layer and/or of the single-crystal substrate being profoundly effected.

Embodiments described herein are directed to a process for producing a multilayer structure that includes, within the depth thereof, a separating layer.

According to an embodiment, this process includes:

in producing an initial multilayer structure comprising a base substrate, a surface substrate and, between the base substrate and the surface substrate, an absorbent layer that can absorb a light power flux in at least one zone and a liquefiable intermediate layer that includes, in at least one zone, impurities having a coefficient of segregation relative to the material constituting this intermediate layer of less than unity; and in subjecting, for a defined time and in the form of at least one pulse, said initial structure to said light power flux, this light power flux being regulated so as to liquefy at least one portion of said intermediate layer under the effect of the propagation of the thermal energy, which results from the absorption of light power in said absorbent layer, from said absorbent layer into said intermediate layer and/or the absorption of light power by said intermediate layer, in such a way that it results, thanks to the initial presence of said impurities, in a modification of at least one characteristic and/or of at least one property of said intermediate layer arising from the at least partial solidification of said intermediate layer, such that this intermediate layer at least partially constitutes a separating layer.

Embodiments described herein make it possible to obtain a final structure having, for example beneath a surface layer intended to be separated, a separating layer whose characteristics and/or properties are different from those of the initial material making up the intermediate layer, in particular the mechanical properties and/or the electrical and/or optical and/or thermal and/or chemical properties, in such a way that said surface layer intended to be separated from the rest of the structure can be physically separated by physically applying, if necessary, to said final structure of mechanical and/or electrical and/or optical and/or thermal and/or chemical treatments, the effects of which on the separating layer are sufficiently differentiated from the effects on the rest of the structure not to impair said surface layer and/or said rest of the structure.

According to an embodiment, said modification may advantageously consist of a modification of the concentration and/or distribution of said impurities in said intermediate layer.

According to an embodiment, said modification may advantageously include an increase in the concentration and/or in the distribution of said impurities in one zone of said intermediate layer.

According to an embodiment, said initial structure may include a single type of material.

According to an embodiment, said initial structure might include different materials.

According to an embodiment, the process may advantageously include a preliminary step of introducing said impurities into said intermediate layer by ion implantation.

According to an embodiment, the material constituting said intermediate layer preferably includes silicon and said impurities are chosen from aluminum and/or bismuth and/or gallium and/or indium and/or antimony and/or tin.

According to an embodiment, the material constituting at least said intermediate layer preferably comprises silicon-germanium.

According to an embodiment, the material constituting at least said surface substrate comprises silicon or silicon-germanium.

According to an embodiment, the material constituting at least said intermediate layer and the material constituting said impurities may advantageously be chosen in such a way that the separating layer contains inclusions.

According to an embodiment, said inclusions preferably include precipitates and/or bubbles and/or micro bubbles and/or defects and/or phase changes and/or changes in chemical composition and/or fractures and/or cavities and/or heterogeneous phases and/or alloys.

According to an embodiment, the material constituting said intermediate layer and the material constituting said impurities may advantageously be chosen in such a way that the separating layer includes weakened portions.

According to an embodiment, said weakening preferably is sufficient to allow physical separation of the base substrate from the surface substrate, possibly with the application of separating forces.

According to an embodiment, the material constituting said intermediate layer and the material constituting said impurities may advantageously be chosen in such a way that the separating layer includes a metallic portion.

According to an embodiment, the material constituting said intermediate layer and the material constituting said impurities may advantageously be chosen in such a way that the separating layer includes a portion whose melting point is lowered.

According to an embodiment, said lowering of the melting point preferably is sufficient to allow, during a subsequent heating step, possibly accompanied by the application of separating forces, physical separation of the base substrate from the surface substrate.

According to an embodiment, the direction of the light power flux may be such that it reaches said absorbent layer after having passed through said intermediate layer.

According to another embodiment, the direction of the light power flux may be such that it reaches said absorbent layer without passing through said layer to be treated.

According to an embodiment, the process may advantageously include subjecting said initial structure to a light power flux that is temporally stationary and scanned relative to this structure.

According to another embodiment, the process may advantageously include subjecting said initial structure to a light power flux which is spatially stationary and modulated in the form of one or more temporal pulses.

According to an embodiment, said light power flux may advantageously include a flux of infrared light.

According to an embodiment said light power flux could advantageously consist of a laser beam.

According to an embodiment, said laser beam may be a $CO_2$ laser.

According to an embodiment, said laser beam could be a chemical laser.

According to an embodiment, said laser beam may be a laser operating at a wavelength of 1.06 microns.

According to an embodiment, said absorbent layer may advantageously include at least one doped zone.

According to an embodiment, said absorbent layer may advantageously include at least one amorphous zone.

According to an embodiment, said absorbent layer preferably includes at least one silicon-germanium zone.

According to an embodiment, said surface substrate and/or said intermediate layer and/or said absorbent layer may advantageously be produced by epitaxy.

The present invention will be more clearly understood thanks to the following nonlimiting explanations with regard to the initial structure and its treatment.

In a first particular embodiment, the base substrate is a block of single-crystal silicon obtained from cutting a cylindrical ingot longitudinally. In a second particular embodiment, the base substrate includes a silicon wafer 200 mm in diameter and 0.75 mm in thickness, doped with antimony with a concentration of $1 \times 10^{19}$ $cm^{-3}$.

The absorbent zone is a zone having a high initial absorption coefficient for the light flux, for example 500 $cm^{-1}$. It should be noted that the absorption coefficient in this zone varies in general during application of the light flux pulse. This is because the rise in temperature itself generally generates an increase in absorption, which itself generates a higher deposition of energy, which itself generates an even greater rise in temperature.

It should also be noted that, owing to thermal diffusion, the layers progressively heat up and therefore there is a progressive rise in light absorption. All this results in general, during energy deposition, in the high-temperature region and/or the liquid phase advancing in the opposite direction to the incident light power flux, with a more rapid rate of advance than that which would correspond to a simple thermal diffusion phenomenon. For this reason, it is judicious in general to place at least one portion of the zone to be treated in such a way that the incident power flux passes through it before reaching the absorbent zone.

The absorbent zone is, in one particular embodiment, all or part of a silicon-germanium (0.85 Si-0.15 Ge) epilayer 10 microns in thickness, which is much more absorbent at the 1.06 micron wavelength than silicon and which has been grown on the base substrate.

In another embodiment, the absorbent zone is a doped zone, for example one doped with arsenic or antimony with a concentration ranging from $10^{18}$ $cm^{-2}$ to a few $10^{19}$ $cm^{-3}$, since this layer is absorbent for the 10.6 micron wavelength of a $CO_2$ laser, whereas undoped silicon has a very low absorption at this wavelength.

In another embodiment, the absorbent zone is produced by low-temperature implantation of silicon ions at an energy of 2 MeV and with a dose of $10^{16}$ $cm^{-2}$ in the layer to be treated, which has the effect of creating, below the surface layer to be treated, at a depth of 1.5 microns, an amorphized zone whose absorption coefficient for a wavelength of 1.06 microns may reach several hundred $cm^{-1}$, whereas that of crystalline silicon lies within the range of about 10 $cm^{-1}$.

The zone to be treated may, in one particular embodiment, be a silicon epilayer doped with tin in situ during growth with a concentration of $10^{19}$ $cm^{-3}$, which epilayer has been grown on an absorbent layer made of arsenic-doped single-crystal silicon. In another particular embodiment, the tin is introduced into said epilayer by the ion implantation of tin ions with a dose of $5 \times 10^{15}$ $cm^{-2}$ and with an energy of 200 keV followed by a diffusion heat treatment at 1150° C. for 12 hours.

In all these examples in which epitaxial growth is used, the epitaxy process may just as well be a CVD process as a liquid phase epitaxy process. In particular, liquid phase epitaxy of silicon from a bath, for example a bath of molten tin or aluminum or indium in which silicon has dissolved, may be one of the preferred methods for producing photovoltaic cells.

Embodiments described herein will also be more clearly understood thanks to the following nonlimiting explanations with regard to the power flux employed.

The duration of the light power flux is chosen to be sufficiently short and the intensity of the power flux is chosen to be sufficiently high for the thermal energy profile to remain sufficiently concentrated and for its level to allow at least partial liquefaction of the zone to be treated.

To obtain a zone of high thermal energy density in the zone to be treated, it is therefore desirable:

to choose a wavelength of the light beam such that most of the power of the light beam is deposited within and/or near the absorption zone;

to choose a duration $\Delta t$ and a power flux that are such that, during application of the power flux, the rate of accumulation of thermal energy within and near the zone to be treated is substantially greater than the rate of losses out of this zone by thermal diffusion; and to choose the intensity of the power flux so that, over the duration Δt, the energy supplied is sufficient to achieve at least partial liquefaction of the zone to be treated.

The choice of Δt and power flux may be determined by simulation, by solving the heat equation, for example using a finite-difference method. This method and its application to the study of the interaction of a light flux with matter are well known and have for example been described in the reference "*Laser nitriding of metals*" by Peter Schaaf, Progress in Materials Science 47 (2002), 1-161.

Moreover, before carrying out any simulation, it is possible to quickly determine the order of magnitude of the energy density to be deposited, using the following rule of thumb given by way of example in the case of silicon: about 7000 J is needed to liquefy 1 cm$^3$ starting from room temperature. When the thickness that it is desired to liquefy has been chosen, all that is required is to multiply 7000 J by the thickness in question and the necessary energy density is obtained. Finally, it is sufficient to take into account the losses by reflection on the surface in order to determine the order of magnitude of the energy density to be injected into the part.

For example, the thickness to be liquefied may be 10 microns, the reflection coefficient may be 0.5 and the order of magnitude of the energy density to be injected may be 14 J/cm$^2$.

The duration of the laser pulses is known. In the case of a triggered laser, this ranges from one to a few tens or hundreds of nanoseconds, depending on the laser. This value is provided by the manufacturer of the laser.

From the necessary energy density and the duration of the pulse, it is possible to deduce the power flux—this gives the starting point for the simulation. The result of the simulation will allow the parameters to be adjusted, if required.

To produce a power flux in pulse form, several methods of implementation are possible:

use of a power flux spatially stationary with respect to the structure to be treated, and the intensity of which as a function of time has the form of one or more pulses; or use of a power flux, the intensity of which as a function of time is stationary, but the position of which varies with respect to the material so that a given region of the material sees the flux only for one or more time intervals corresponding to the duration of the desired pulse (or pulses); or a combination of the above two methods of implementation.

To carry out the invention with a spatially stationary light power flux, it is possible, as a nonlimiting example, to use a $CO_2$ laser of the TEA type. This category of laser is in fact well suited to delivering high-power pulses with a duration ranging from a few tens of ns to a few hundred ns, thus generating energies of the order of a few tens to a few hundred mJ per pulse.

In one particular embodiment, a TEA $CO_2$ laser delivering 100 mJ pulses in 100 ns is used. The beam is focused onto an area of 1 mm$^2$, which makes it possible to obtain a power density of 100 MW/cm$^2$ and an energy density of 10 J/cm$^2$. To treat a large area after each pulse, the part to be treated may be moved so as to treat a new part. Thus, with a laser of the aforementioned type, having a pulse repetition frequency of 100 Hz, the part to be treated is moved about 1 mm, which corresponds to an average speed of 0.1 m/s and may be achieved for example by fixing the part to be treated to a motor-driven table.

As one particular embodiment, to obtain a temporally stationary light power flux, a $CO_2$ laser operating in continuous mode and delivering a power of 7 kW may be used. The light beam is, after it leaves the laser, expanded by an optical expander system in such a way that the beam, after the expander, is substantially parallel and has a diameter of about 25 cm. This beam is deflected by a mirror and then propagates vertically. A focusing system is then placed in the path of the beam with a focal length of the order of 1 m. The beam is then deflected by a rotating mirror in such a way that the beam thus deflected propagates in a substantially horizontal plane. The rotating mirror is carried by a support that rotates about an axis approximately coincident with the axis of the optical focusing system. By rotating, this mirror causes the axis of the reflected beam to rotate in such a way that, each time the mirror makes one revolution, the focal spot of the beam describes a circumference in a horizontal plane. The surface of the parts to be treated is placed in such a way that it lies on this circumference. Thus, at each rotation of the mirror, the points on the surface of the parts that are located on said circumference are treated.

Complementarily, to treat the entire surface of the parts to be treated, it is possible to fix the structures to be treated to a cylindrical support capable of moving vertically in such a way that all the points of a structure to be treated can be exposed to the laser flux.

In one particular embodiment, the beam is focused onto a diameter of 80 microns, the radius of the circumference is 70 cm and the rotation speed of the mirror is 364 Hz, i.e. at about 22000 rpm. Under these conditions, each point is exposed to a power flux having a density of 100 MW/cm$^2$ for a time of 100 ns and with an energy density of 14 J/cm$^2$.

The optical expander and focusing systems may be produced just as well in diffractive optics as in reflecting optics. It should also be noted that instead of using a laser operating in continuous mode, it is also possible to use this same type of laser operating in discontinuous mode, in which the laser delivers a train of long pulses (lasting several microseconds to several hundred microseconds) during which the power delivered by the laser is much greater than the average power.

Wafers comprising a base substrate made of silicon doped with arsenic to a level of $10^{18}$/cm$^3$, the upper portion of which constitutes the absorbent layer, a layer to be treated with a thickness of 7 microns, doped with tin to a concentration of $10^{19}$ cm$^{-3}$ and undoped silicon surface epilayer 20 microns in thickness, constituting the layer intended to be separated, are fixed to the inner peripheral part of said internal surface. The surface of the layer intended to be separated is optionally coated with thin film, for example antireflection films and/or thick films serving for example as stiffeners.

The light power pulse received liquefies the material between a depth of about 21 microns and a depth of about 27 microns.

These values may vary substantially according to the variation according to the function of time of the power flux pulse and of the shape of the absorption profile as a function of depth.

The liquid zone is thus limited by a solid/liquid interface at a depth of greater than 21 microns and a solid/liquid interface at a depth of less than 27 microns.

Most of the tin atoms preexisting in the solid phase in this zone and in the immediate vicinity thereof are found in the liquid phase. During resolidification that occurs upon cooling, the two solid/liquid interfaces each advance at their own rate towards each other, thus reducing the width of the liquid zone.

Owing to the low value of the segregation coefficient (sometimes called the distribution coefficient) of tin in silicon, that is to say owing to the fact that the tin atoms tend to remain in the liquid phase rather than passing into the solid phase, the advance of the two solid/liquid interfaces is manifested in front of them by a thrust effect, in which a large part of the tin atoms are thrust into the liquid phase, thus resulting in an ever increasing concentration of tin atoms in the liquid phase.

Correlatively, the result is a tin depletion of the resolidified part of the material. Overall, the result after the end of recrystallization is a concentration profile in the form of a very narrow bell curve, the apex of which lies on or near the plane where the solidification interfaces meet.

When the liquid phase has disappeared, the tin atoms that were present in the liquid phase just before its disappearance necessarily are in the material in the solid state. This may result, locally, for judiciously chosen experimental conditions, in a very high concentration of impurities in a narrow zone near the depth, called the meeting depth, in which the two solid/liquid interfaces meet and therefore in which the liquid phase has completely disappeared.

The situation may then possibly be one in which the tin atoms have a concentration such that these atoms can no longer be normally incorporated into the solid phase, thus giving rise to the formation of inclusions.

The resulting inclusions may be agglomerates of particles, bubbles, both of substantially spherical shape and flattened shape, for example resulting from impurities, precipitates of atoms or molecules, precipitates of defects, cavities, structural defects, fractures, new chemical compounds, new phases, heterogeneous phases, alloys, or any combination of these elements, passing into the gas phase.

Thus it is possible to weaken the material through this mechanism and to enable that portion of the material lying between the surface and the weakened zone to be separated from the rest of the material.

It is also possible, to form, near the plane where the solidification interfaces meet, a zone whose melting point is lower than that of silicon. It may for example be advantageously employed to separate the surface portion of the material above the meeting plane from the rest of the material by heating the whole assembly to the melting point of the zone of the meeting plane and possibly by exerting separating forces.

The resolidification phenomenon may be more complex than that described above. This is because the advance of the two, upper and lower, interfaces may be combined with an advance of the lateral interfaces, and even with the formation of discontinuous liquid zones separated by resolidified zones. However, whatever the complexity of the mechanisms involved, this always ends up with the impurities being concentrated in a very small volume of material.

In the above example, tin atoms are used. The principle also applies for other atoms having a low segregation coefficient relative to silicon, such as for example, but not limited to: aluminum, bismuth, gallium, indium and tin. However, if a light wavelength is used in which one of the absorption mechanisms is due to free carriers, which is the case for example for a $CO_2$ laser, the choice of said impurities will be limited to those that do not generate significant numbers of free carriers under the conditions of the experiment. In particular in the case of using a $CO_2$ laser, dopants such as aluminum, indium, gallium, bismuth and antimony will not be used, or only with a low concentration.

BRIEF DESCRIPTION OF THE DRAWINGS

To illustrate the present invention, in particular the above examples and explanations, in a general and schematic way, the reader may refer to the appended drawing in which.

Figure 1:
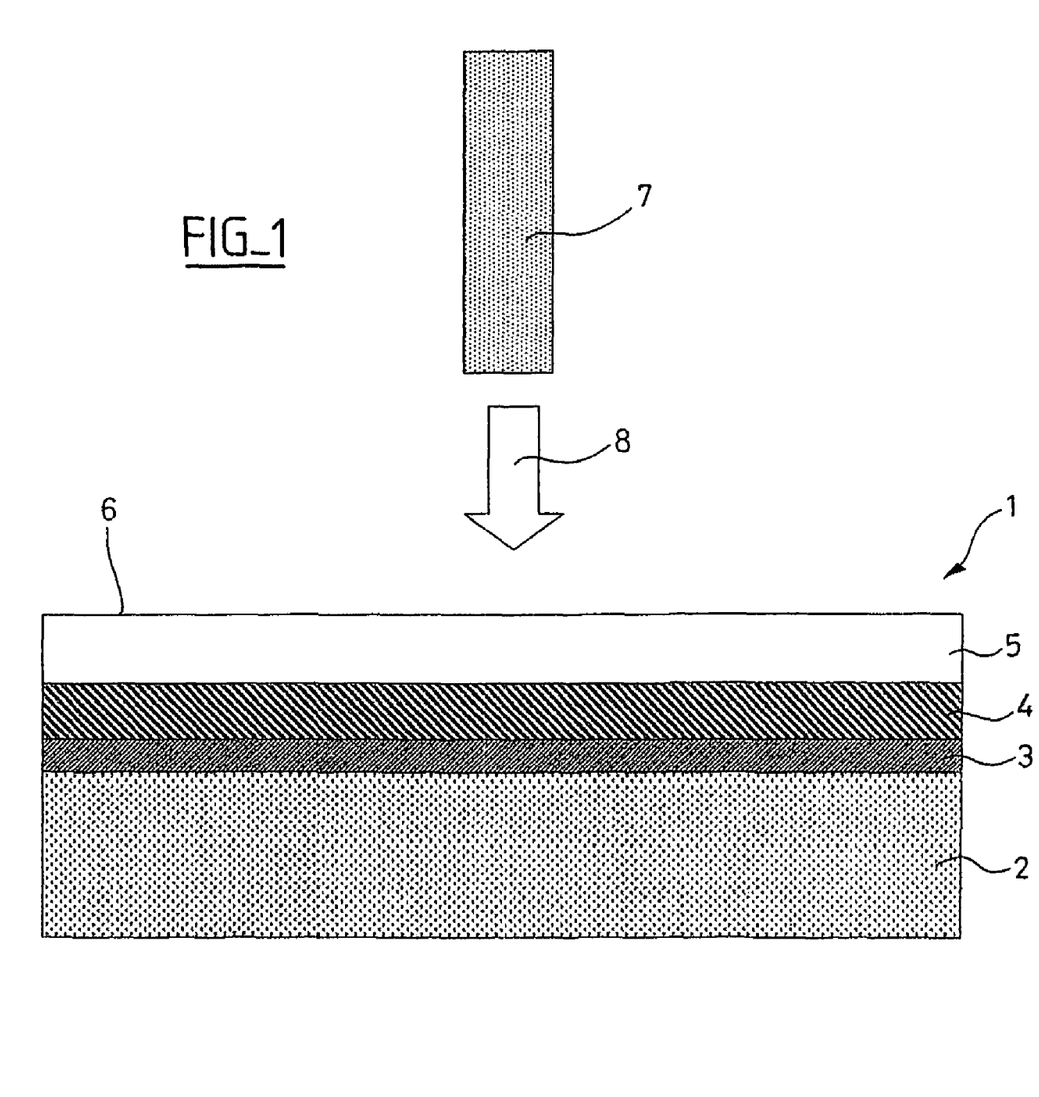
FIG. 1 shows a cross section of an initial structure according to the invention.

Referring to FIG. 1, this shows an initial multilayer structure 1, based on silicon, which includes a base substrate 2 on which have been formed, in succession, an absorbent layer 3, an intermediate layer 4 to be treated and a surface substrate 5 intended to be separated, which has an external flat surface 6. In a variant, the absorbent layer 3 and the intermediate layer 4 could be reversed.

Using an apparatus 7 for emitting a pulsed light power flux 8 in front of and at a short distance from the flat surface 6, the initial structure 1 is subjected to this flux, which is preferably directed so as to be perpendicular to the surface 6 but which could also be inclined thereto.

The light power flux 8 introduced into the structure 1 passes through the surface substrate 5 and the intermediate layer 4, reaches the absorbent layer 3 and causes the temperature of the latter to rise and possibly results in at least partial liquefaction of its constituent material.

The effect of the thermal energy resulting from the absorption of the light power flux 8 in the absorbent layer 3 propagating from this absorbent layer 3 toward the intermediate layer 4 is to cause a rise in the temperature and liquefaction of material of at least part of the intermediate layer 4, it being possible for said temperature rise of the intermediate layer 4 and the liquid phase 9 thus produced to also contribute to the absorption of the light power.

Figure 2:
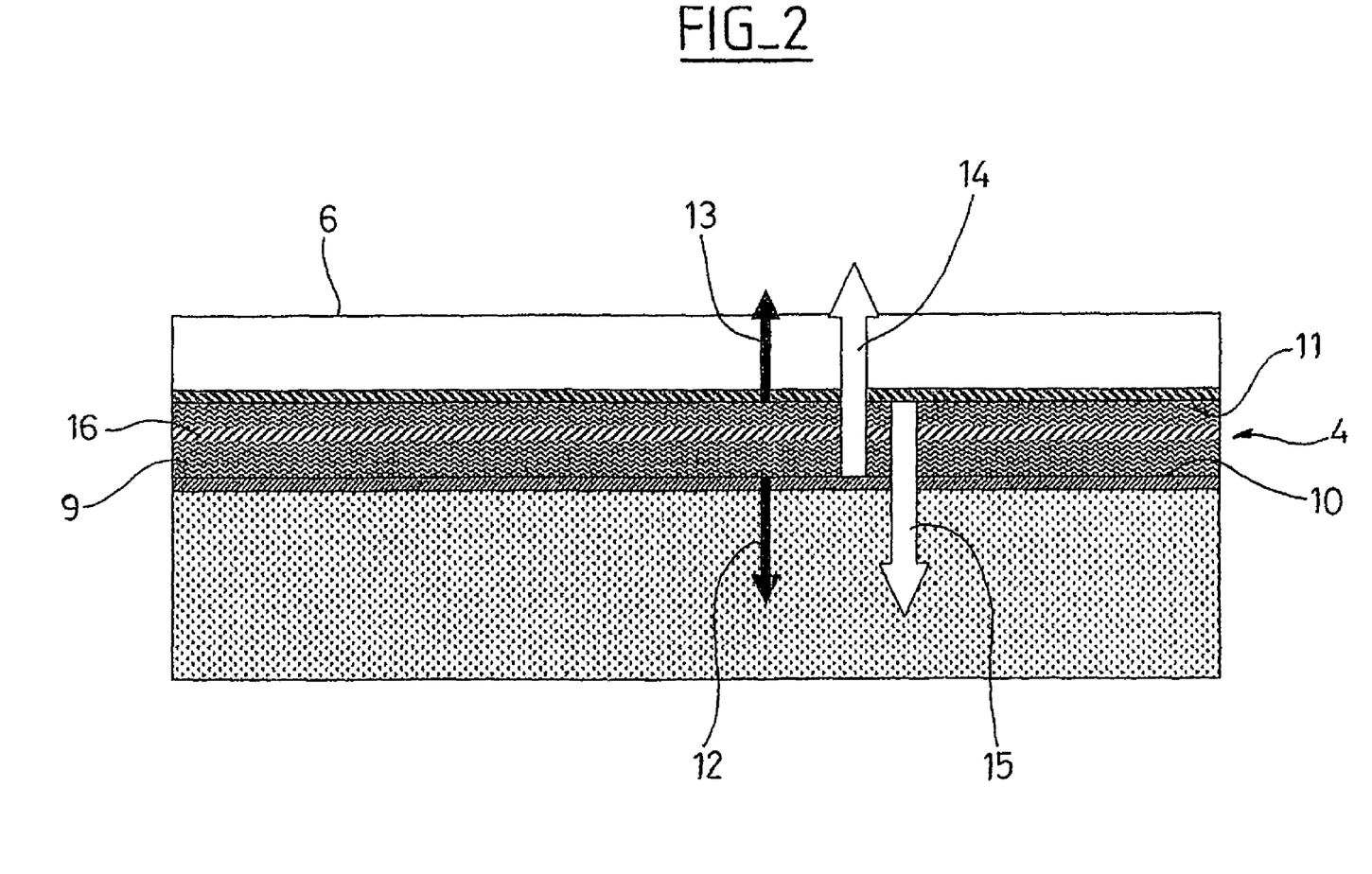
FIG. 2 shows a cross section of this structure during treatment.

As shown in FIG. 2, this liquefaction takes place in the following manner. The liquid phase 9 contained approximately between two solid/liquid interfaces 10 and 11 substantially parallel to the surface 6 grows progressively in thickness as the light power flux 4 continues to be applied, as shown by the arrows 12 and 13 attached to these interfaces, until a maximum is reached. It should be noted that the rates of advance of the two interfaces 10 and 11 may be significantly different.

It follows from the above that the absorbent layer 3, which absorbs the light power flux 8 and converts it into thermal energy, constitutes that element of the structure 1 which triggers and generates the liquefaction of the intermediate layer 4, the light power flux 8 being less absorbed in the region of the surface substrate 5.

The above liquefaction phase is followed by a material resolidification phase, which causes a progressive reduction in the distance between the interfaces 10 and 11, as the arrows 14 and 15 attached to these interfaces show. This resolidification phase generally and essentially takes place after the pulse of the light power flux 4 has been applied.

During the aforementioned material liquefaction phase, the impurities contained in the intermediate layer 4 pass into solution in the liquid phase 9.

During the aforementioned material resolidification phase, the impurities have a tendency to remain in the liquid phase 9 so that, at the end of the material resolidification phase, most of these impurities are concentrated in a portion or layer 16 of the initial intermediate layer 4 that resolidifies last, that is to say in a volume of silicon whose thickness is much smaller, for example of the order of a few tens of nanometers, than the aforementioned maximum thickness of the liquid phase 9.

These impurities may then be in the portion 16 possibly with concentration levels much higher than the limiting solubility in the solid phase, thus forming precipitates and/or crystal defects that weaken the material in the concentration zone 16.

In general, the high concentration of impurities in the portion 16 significantly modifies the properties or characteristics of the material, so that it is possible to apply a subsequent treatment to the structure 1 that alters the portion 16 but does not alter the rest of the structure.

This subsequent treatment of the structure 1 may advantageously allow it to be divided into two wafers, one of which includes the base substrate 2 and the other the surface substrate 5, this separation taking place in the weakened portion or layer 16 in the increased concentration of impurities. For example, application of force, whether or not combined with a heat treatment, or vice versa, may be used to achieve this separation.

Figure 3:
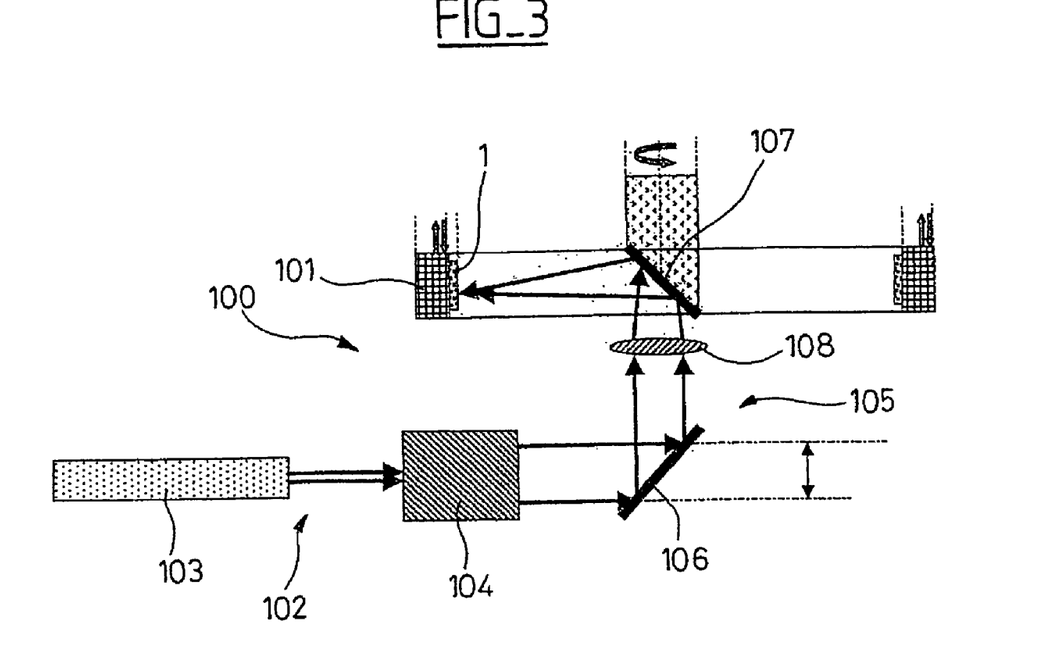
FIG. 3 shows a vertical cross section of a first apparatus for treating an initial structure.
Figure 4:
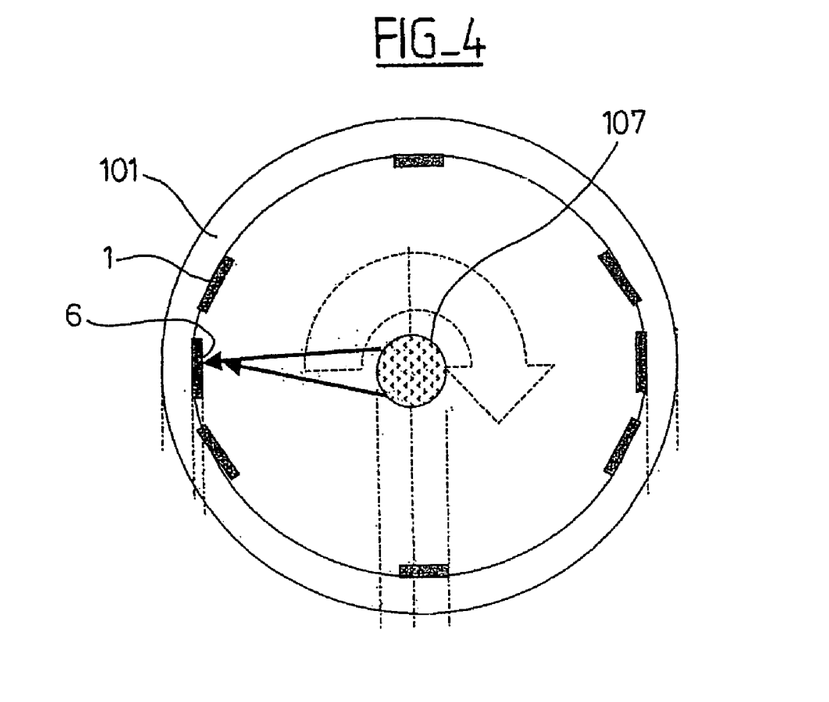
FIG. 4 shows a top view of the apparatus of FIG. 3.

FIGS. 3 and 4 show an apparatus 100 for treating initial structures 1.

This apparatus includes a cylindrical support 101 of vertical axis, on an internal face of which are fixed, distributed around a circumference, initial structures 1 to be treated, the faces of which are placed vertically are turned toward the axis of the support 101.

The apparatus 100 includes a generator 102 that generates a temporally stationary light power flux, which generator is placed beneath the support 101 and includes a laser emitter 103 which emits toward an optical expander 104 in such a way that the flux output by this expander 104 is horizontal and the axis of which cuts the axis of the support 101.

The apparatus 100 includes an optical system 105 which includes a fixed mirror 106 inclined at 45°, which deflects, vertically upward, the flux output by the expander 104 in the direction of a rotating mirror 107, via a focusing lens 108, this rotating mirror 107 being placed at the center of the support 101, at 45°, and its rotational axis lying along the axis of the support 101 in such a way that the light power flux reflected by the rotating mirror 105 is directed toward the inner face of the support 101.

Thus, when the rotating mirror 107 is being rotated, the light power flux scans, horizontally, and in succession, the structures 1 to be treated, by actuating means (not shown) for moving the support 101 vertically. It is therefore possible to scan the entire surface 6 of the structures 1 to be treated in the form of pulses.

The present invention is not limited to the examples described above. Many variants are possible without departing from the scope of the appended claims.

What is claimed is:

1. A process for producing a multilayer structure that includes, within the depth thereof, a separating layer, comprising:

producing an initial multilayer structure comprising a base substrate, a surface substrate and, between the base substrate and the surface substrate, an absorbent layer that can absorb a light power flux in at least one zone and a liquefiable intermediate layer that includes, in at least one zone, impurities having a coefficient of segregation relative to the material constituting this intermediate layer of less than unity; and subjecting, in the form of at least one pulse, said initial structure to said light power flux, this light power flux being regulated so as to liquefy at least one portion of said intermediate layer under the effect of the propagation of the thermal energy, which results from the absorption of light power in said absorbent layer, from said absorbent layer into said intermediate layer and/or the absorption of light power by said intermediate layer, wherein due to the initial presence of said impurities, in a modification of at least one characteristic and/or of at least one property of said intermediate layer arising from the at least partial solidification of said intermediate layer, such that this intermediate layer at least partially constitutes a separating layer.

2. The process as claimed in claim 1, wherein said modification comprises a modification of the concentration and/or distribution of said impurities in said intermediate layer.

3. The process as claimed in claim 1, wherein said modification comprises an increase in the concentration and/or in the distribution of said impurities in one zone of said intermediate layer.

4. The process as claimed in claim 1, wherein said initial structure comprises a single type of material.

5. The process as claimed in claim 1, wherein said initial structure comprises different materials.

6. The process as claimed in claim 1, further comprising a preliminary step of introducing said impurities into said intermediate layer by ion implantation.

7. The process as claimed in claim 1, wherein the material constituting said intermediate layer comprises silicon and said impurities are chosen from aluminum and/or bismuth and/or gallium and/or indium and/or antimony and/or tin.

8. The process as claimed in claim 1, wherein the material constituting at least said intermediate layer comprises silicon-germanium.

9. The process according to claim 1, wherein the material constituting at least said surface substrate comprises silicon or silicon-germanium.

10. The process as claimed in claim 1, wherein the material constituting at least said intermediate layer and the material constituting said impurities are chosen in such a way that the separating layer contains inclusions.

11. The process as claimed in claim 10, wherein said inclusions comprise precipitates and/or bubbles and/or micro bubbles and/or defects and/or phase changes and/or changes in chemical composition and/or fractures and/or cavities and/or heterogeneous phases and/or alloys.

12. The process as claimed in claim 1, wherein the material constituting said intermediate layer and the material constituting said impurities are chosen in such a way that the separating layer includes weakened portions.

13. The process as claimed in claim 12, wherein said weakening is sufficient to allow physical separation of the base substrate from the surface substrate, possibly with the application of separating forces.

14. The process as claimed in claim 1, wherein the material constituting said intermediate layer and the material constituting said impurities are chosen in such a way that the separating layer includes a metallic portion.

15. The process as claimed in claim 1, wherein the material constituting said intermediate layer and the material constituting said impurities are chosen in such a way that the separating layer includes a portion whose melting point is lowered.

16. The process as claimed in claim 15, wherein said lowering of the melting point is sufficient to allow, during a subsequent heating step, possibly accompanied by the application of separating forces, physical separation of the base substrate from the surface substrate.

17. The process as claimed in claim 1, wherein the direction of the light power flux is such that it reaches said absorbent layer after having passed through said intermediate layer.

18. The process as claimed in claim 1, wherein the direction of the light power flux is such that it reaches said absorbent layer without passing through said layer to be treated.

19. The process as claimed in claim 1, further comprising subjecting said initial structure to a light power flux that is temporally stationary and scanned relative to this structure.

20. The process as claimed in claim 1, characterized in that it consists in subjecting said initial structure to a light power flux which is spatially stationary and modulated in the form of one or more temporal pulses.

21. The process as claimed in claim 1, wherein said light power flux consists of a flux of infrared light.

22. The process as claimed in claim 1, wherein said light power flux is a laser beam.

23. The process as claimed in claim 22, wherein said laser beam is a $CO_2$ laser.

24. The process as claimed in claim 22, wherein said laser beam is a chemical laser.

25. The process as claimed in claim 22, wherein said laser beam is a laser operating at a wavelength of 1.06 microns.

26. The process as claimed in claim 1, wherein said absorbent layer includes at least one doped zone.

27. The process as claimed in claim 1, wherein said absorbent layer includes at least one amorphous zone.

28. The process as claimed in claim 1, characterized in that said absorbent layer includes at least one silicon-germanium zone.

29. The process as claimed in claim 1, wherein said surface substrate and/or said intermediate layer and/or said absorbent layer are produced by epitaxy.

* * * * *